United States Patent
Desvergne et al.

(10) Patent No.: US 12,407,346 B2
(45) Date of Patent: Sep. 2, 2025

(54) SWITCH AND SAMPLING CIRCUIT

(71) Applicants: STMicroelectronics (Grenoble 2) SAS, Grenoble (FR); STMicroelectronics (Alps) SAS, Grenoble (FR)

(72) Inventors: Matthieu Desvergne, Claix (FR); Marc Sabut, Eybens (FR); Emmanuel Allier, Grenoble (FR); Thierry Masson, Varces (FR)

(73) Assignees: STMicroelectronics (Alps) SAS, Grenoble (FR); STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 18/191,491

(22) Filed: Mar. 28, 2023

(65) Prior Publication Data
US 2023/0327666 A1 Oct. 12, 2023

(30) Foreign Application Priority Data
Apr. 8, 2022 (FR) ...................................... 2203241

(51) Int. Cl.
*H03K 17/687* (2006.01)
*H03K 17/10* (2006.01)
*H03K 17/22* (2006.01)

(52) U.S. Cl.
CPC ....... *H03K 17/6871* (2013.01); *H03K 17/102* (2013.01); *H03K 17/223* (2013.01)

(58) Field of Classification Search
CPC ............. H03K 17/6871; H03K 17/102; H03K 17/223; H03K 2217/0054; H03K 17/002; H03K 17/6874; H03K 17/693; H03K 17/08104
See application file for complete search history.

(56) References Cited

U.S. PATENT DOCUMENTS

| | | | |
|---|---|---|---|
| 2013/0154718 A1 | 6/2013 | Huijsing et al. | |
| 2014/0266381 A1* | 9/2014 | Biskup | H03K 19/018521 327/311 |
| 2014/0368255 A1* | 12/2014 | Hayasaka | H03K 17/08104 327/427 |
| 2016/0013787 A1* | 1/2016 | Huijsing | H03K 17/08104 327/434 |

FOREIGN PATENT DOCUMENTS

| | | | | |
|---|---|---|---|---|
| CN | 109004813 A | | 12/2018 | |
| CN | 112909073 A | * | 6/2021 | ......... H01L 21/0337 |
| WO | WO-2020229490 A1 | * | 11/2020 | ............. H02H 9/005 |

* cited by examiner

*Primary Examiner* — Metasebia T Retebo
(74) *Attorney, Agent, or Firm* — Slater Matsil, LLP (57) ABSTRACT

In an embodiment a switch includes a first MOS transistor having its source connected to its channel-forming region and coupled with a first terminal of the switch, its drain coupled with a second terminal of the switch, and its gate connected to a first node of the switch, a diode coupling the first terminal with the first node, a capacitive element coupling a third terminal of the switch with the first node, the third terminal being configured to receive a control signal for the switch and a discharge circuit coupling the first node with the first terminal, the discharge circuit configured to conduct only when a voltage between the first node and the first terminal is greater than or equal to a threshold.

19 Claims, 4 Drawing Sheets

SWITCH AND SAMPLING CIRCUIT

CROSS-REFERENCE TO RELATED APPLICATIONS

This application claims the benefit of French Application No. 2203241, filed on Apr. 8, 2022, which application is hereby incorporated herein by reference.

TECHNICAL FIELD

The present disclosure generally relates to integrated electronic circuits, and more particularly switches, particularly switches implemented in sampling circuits.

BACKGROUND

Many electronic circuits, for example, circuits for sampling a voltage, comprise switches. These switches are configured to transmit a voltage present on a first one of their conduction nodes to the second one of their conduction nodes when they are switched to the on state.

However, the implementation of such a switch by means of a MOS ("Metal Oxide Semiconductor") transistor raises various issues. For example, the voltage present on the first node of a switch comprising a MOS transistor may be greater than the maximum voltages withstood by the MOS transistor of the switch. This is for example the case in a circuit for sampling a voltage implemented by means of such switches.

SUMMARY

Embodiments provide switches comprising MOS transistors, sampling circuits and analog to digital converters.

An embodiment provides a switch comprising:
a first MOS transistor having its source connected to its channel-forming region and coupled with a first terminal of the switch, its drain coupled with a second terminal of the switch, and its gate connected to a first node of the switch;
a diode coupling the first terminal with the first node;
a capacitive element coupling a third terminal of the switch with the first node, the third terminal being configured to receive a control signal of the switch; and
a discharge circuit coupling the first node with the first terminal, configured to conduct only when a voltage between the first node and the first terminal is greater than or equal to a threshold.

According to an embodiment, the discharge circuit comprises two Zener diodes series connected and reverse connected with respect to each other between a terminal of the discharge circuit coupled, for example connected, with the first node and a terminal of the discharge circuit coupled, for example connected, with the first terminal.

According to an embodiment, the switch further comprises a buffer circuit connected between the third terminal and the capacitive element.

According to an embodiment, the diode has its anode towards the first terminal.

According to an embodiment, the switch further comprises a resistor in series with the first transistor between the first and second terminals.

According to an embodiment, the resistor is connected between the first terminal and the source of the first transistor.

According to an embodiment, the switch further comprises a second MOS transistor having its gate connected to the gate of the first MOS transistor, its source connected to the source of the first transistor and with a channel-forming region of the second transistor, and its drain connected to the first terminal.

An embodiment provides a sampling circuit comprising first, second, third, and fourth switches such as described, wherein:
the first and second switches have their first terminals coupled with a first input of the sampling circuit, the third and fourth switches having their first terminals coupled with a second input of the sampling circuit;
the first and third switches have their second terminals coupled with a first output of the sampling circuit, the second and fourth switches having their second terminals coupled with a second input of the sampling circuit; and
the first and fourth switches have their third terminals intended to receive a first control signal, the second and third switches having their third terminals intended to receive a second control signal.

An embodiment provides an analog-to-digital converter comprising a sampling circuit such as described.

According to an embodiment, the converter comprises a first input confused with the first input of the sampling circuit and a second input confused with the second input of the sampling circuit, the converter being intended to receive an analog voltage to be converted between its first and second inputs.

According to an embodiment, the converter further comprises an operational amplifier, for example mounted as a differential integrator, a first input of the amplifier being coupled with the first output of the sampling circuit and a second input of the amplifier being coupled with the second output of the sampling circuit.

According to an embodiment, the converter further comprises:
a first capacitive element having a first electrode connected to the first output of the sampling circuit;
a second capacitive element having a first electrode connected to the second output of the sampling circuit;
a fifth switch connected between a second electrode of the first capacitive element and the first input of the amplifier;
a sixth switch connected between the second electrode of the first capacitive element and a second node configured for receiving a first potential;
a seventh switch connected between a second electrode of the second capacitive element and the second input of the amplifier, and
an eighth switch connected between the second electrode of the second capacitive element and the second node.

According to an embodiment, the converter further comprises:
a third capacitive element connected between a first output of the amplifier and the second input of the amplifier; and
a fourth capacitive element connected between a second output of the amplifier and the first input of the amplifier.

According to an embodiment, the converter is configured to carry a sigma-delta conversion.

An embodiment provides a system comprising:
a switch having a first input connected to a load and a second input connected to a charger;

a battery and a sense resistor in series between a node for applying the ground and an output of the switch; and a converter such as described, the sense resistor being connected between the first and second inputs of said converter.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the known electronic circuits, particularly the known electronic voltage sampling circuits, comprising switches comprising a MOS transistor have not been detailed, the described embodiments and variants of MOS transistor switches being compatible with these known circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, unless indicated otherwise, the voltage of a node corresponds to the voltage taken on this node and referenced with respect to a reference voltage, for example, the ground, and the voltage between two nodes corresponds to the difference between the voltage of one of the two nodes and the voltage of the other one of the two nodes.

Figure 1:
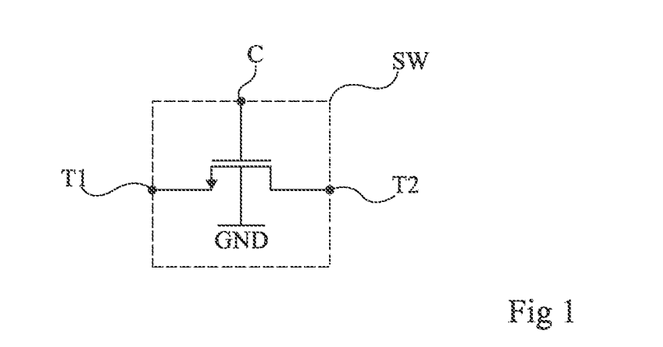
FIG. 1 illustrates an example of a switch comprising a MOS transistor.

FIG. 1 illustrates an example of a switch SW comprising a MOS transistor.

Conventionally, switch SW comprises a first conduction terminal T1, a second conduction terminal T2, and a control terminal C. According to a control signal applied to terminal C, switch SW is selectively on or off. In the on state, the voltage on terminal T1 is transmitted on terminal T2, to within the voltage drop between terminals T1 and T2. In the off state, terminal T1 is isolated from terminal T2 or, in other words, switch T2 comprises no conductive track between its terminals T1 and T2.

In the example of FIG. 1, switch SW is implemented by a MOS transistor having its source connected to terminal T1, its drain connected to terminal T2, and its gate connected to terminal C. Further, the MOS transistor of switch SW has its body region, that is, its channel-forming region, connected to a node of application of a reference voltage, typically ground GND. As an example, the MOS transistor of switch SW is an N-channel MOS transistor.

In the example of FIG. 1, the signal applied to terminal C to turn on switch SW corresponds to a voltage having a constant value. As a result, the voltage drop between terminals T1 and T2 of switch SW in the on state depends on the value of the voltage on terminal T1, which is not desirable. For example, when switch SW forms part of a voltage sampling circuit, this causes distortions on the value of the sampled voltage.

Further, in the example of FIG. 1, when the voltage on terminal T1 is higher than the maximum voltage difference that the MOS transistor of switch SW can withstand between its gate and its source, or than the maximum voltage difference that the MOS transistor of switch SW can withstand between its source and its channel-forming region, this may cause a destruction of the MOS transistor of switch SW, which is not desirable. As an example, this is for example the case when the voltage on terminal T1 is greater than 10 V, or even greater than 50 V or even 100 V, for example when the voltage on terminal T1 is equal to approximately 65 V.

Figure 2:
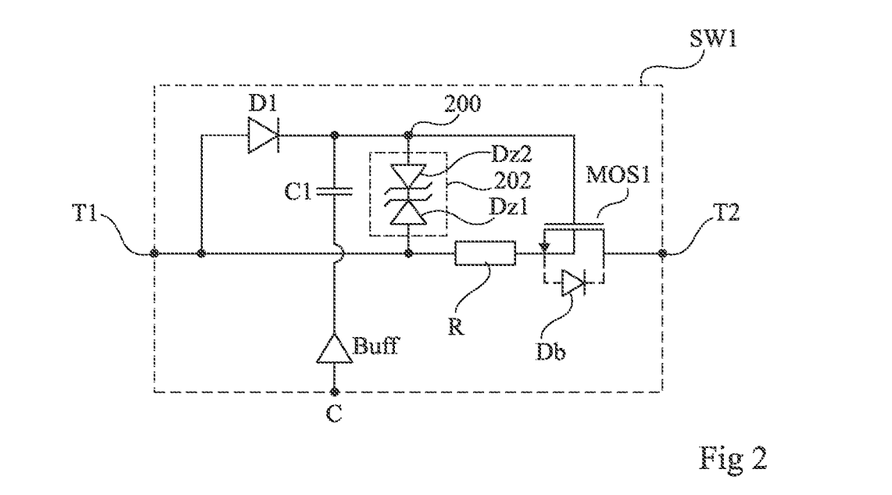
FIG. 2 illustrates an embodiment of a switch comprising a MOS transistor.

FIG. 2 illustrates an embodiment of a MOS transistor switch SW1.

Switch SW1 comprises, like switch SW, terminals T1, T2, and C. In the same way as for switch SW, the on or off state of switch SW1 is selectively controlled by the signal applied to its terminal C, so that, in the on state, the voltage on terminal T1 is transmitted to terminal T2 and, in the off state, terminal T1 is isolated from terminal T2.

Switch SW1 comprises a MOS transistor MOS1. Transistor MOS1, for example, with an N-channel, has its source coupled to terminal T1, its drain coupled, preferably connected, to terminal T2, and its gate coupled to terminal C. More particularly, the gate of transistor MOS1 is connected to a node 200 of switch SW1, node 200 being coupled to terminal C.

Conversely to the MOS transistor of the switch SW of FIG. 1, transistor MOS1 has its source connected to its channel-forming region. Thus, whatever the voltage on the source of transistor MOS1, the voltage difference between the source and the channel-forming region of transistor MOS1 is zero and thus remains lower than the maximum voltage that transistor MOS1 can withstand between its source and its channel-forming region. This is not the case of the MOS transistor of switch SW, which has a voltage difference between its source and its channel-forming region which is equal to the voltage on the terminal T1 of switch SW.

Switch SW1 further comprises a diode D1 coupling terminal T1 to node 200, that is, to the gate of transistor MOS1. Diode D1 has a first terminal, for example, its anode, coupled, preferably connected, to terminal T1, and a second terminal, for example, its cathode, coupled, preferably connected, to node 200. In other words, the first terminal of diode D1 is on the side of terminal T1. In addition to diode D1, switch SW1 comprises a capacitive element C1, for example, a capacitor, coupling node 200 to terminal C. As an example, capacitive element C1 has a first electrode coupled, preferably connected, to node 200, and a second electrode coupled to terminal C.

In the example of FIG. 2, the second electrode of capacitive element C1 is coupled to terminal C by a buffer circuit Buff. For example, circuit Buff has an input coupled, preferably connected, to terminal C, and an output coupled, preferably connected, to the second electrode of capacitive element C1. As an example, circuit Buff is configured to deliver a binary signal having a first level corresponding to a power supply voltage Vdd and having a second level corresponding to a zero voltage, the level of the binary signal delivered by circuit Buff depending on the voltage level of a binary signal received by circuit Buff, for example, on the voltage level received by terminal C of switch SW1.

In alternative examples, not illustrated, circuit Buff is omitted, for example, when circuit Buff is arranged outside of switch SW1, for example when the binary signal delivered by circuit Buff is delivered to a plurality of terminals C of a plurality of corresponding switches SW1. In these alternative examples where circuit Buff is omitted from switch SW1, the second terminal of capacitive element C1 is for example connected to terminal C.

The case where the voltage on terminal T1 has a first value is considered as an example. When the signal received by capacitive element C1 from terminal C is at a zero voltage, diode D1 enables to charge node 200 to a voltage equal to the voltage on terminal T1 minus the threshold voltage of diode D1. The voltage between the gate and the source of transistor MOS1 is then smaller than the threshold voltage of transistor MOS1, which remains in the off state. When the signal received by capacitive element C1 from terminal C is switched to a non-zero positive voltage, for example, at power supply voltage Vdd, the voltage on node 200 increases and becomes equal to the voltage on terminal T1 minus the threshold voltage of diode D1 plus voltage Vdd. Voltage Vdd is determined according to the threshold voltage of transistor MOS1, so that the latter switches to the on state. Further, voltage Vdd is smaller than the maximum gate-source voltage that transistor MOS1 can withstand, so that the latter is not damaged. As an example, voltage Vdd is in the range from 2 V to 6 V, for example, approximately equal to 5 V.

It is now considered as an example that the voltage on terminal T1 increases to a second value greater than the first one. When the signal received by capacitive element C1 from terminal C is at the zero voltage, node 200 charges to a voltage equal to the voltage on terminal T1 minus the threshold voltage of diode D1. In other words, the voltage of node 200 increases with the voltage of terminal T. When the signal received by capacitive element C1 from terminal C is switched to power supply voltage Vdd, the voltage on node 200 increases and becomes equal to the voltage on terminal T1 minus the threshold voltage of diode D1 plus voltage Vdd.

The two above examples of operation illustrate the fact that, in switch SW1, when the terminal C of switch SW receives a control signal in a high state corresponding to a constant voltage value given so that switch SW1, and more particularly its transistor MOS1, switch to the on state, the voltage difference between the source and the gate of transistor MOS1 remains constant even if voltage T1 increases, which is not the case in the switch SW of FIG. 1.

Switch SW1 further comprises a discharge circuit 202 coupling node 200 to terminal T1. For example, circuit 202 has a first terminal coupled, preferably connected, to node 200 and a second terminal coupled, preferably connected, to terminal T1. Circuit 202 is configured to only be conductive if the voltage between its first and second terminals is greater than or equal to a threshold Vt, that is, only if the voltage corresponding to the subtraction of the voltage on its second terminal to the voltage on its first terminal is greater than or equal to threshold Vt. Still in other words, circuit 202 is configured to only be conductive when the voltage between node 200 and terminal T1 is greater than a threshold, that is, threshold Vt in the example of FIG. 2 where circuit 202 has its first terminal connected to node 200 and its second terminal connected to terminal T1.

According to an embodiment, threshold Vt is selected to be greater than the value of the high voltage level received by capacitive element C1 from terminal C, and smaller than the maximum voltage value that transistor MOS1 can withstand between its gate and its source without being damaged. Thereby, circuit 202 corresponds to an open circuit when switch SW1 is controlled to the on state, which does not modify the operation of switch SW1 described hereabove. Further, if the voltage on terminal T1 decreases to a value such that the voltage difference between the first terminal and the second terminal of circuit 202 exceeds threshold Vt, circuit 202 becomes conductive, which enables to discharge node 200, so that the voltage difference between the gate and the source of transistor MOS1 remains smaller than the maximum voltage that transistor MOS1 can withstand between its gate and its source without being damaged.

According to an embodiment, circuit 202 comprises diodes, at least two of which are connected in series and head to tail, that is, in series and in reverse with respect to each other.

For example, in FIG. 2, circuit 202 comprises two Zener diodes Dz1 and Dz2 connected in series and head to tail between the two terminals of circuit 202. For example, diode Dz1 has its anode coupled, for example, connected, to the terminal of circuit 202 which is coupled or connected to terminal T1, and diode Dz2 has its anode coupled, for example, connected, to the terminal of circuit 202 which is coupled or connected to node 200. In this case, threshold Vt is equal to Vb+Vt, Vb being the avalanche voltage of diode Dz2 and Vd the threshold voltage of diode Dz1. For example, threshold Vt is equal to 5.6 V when Vb is equal to 5 V and Vd is equal to 0.6 V.

Further, due to the fact that the source and the body region of transistor MOS1 are connected, when transistor MOS1 is in the off state but the voltage difference between the source and the drain of transistor MOS1 exceeds the threshold of the body diode Db of transistor MOS1 (shown in dotted lines in FIG. 2), a current flows from the source to the drain of transistor MOS1 via diode Db. When the voltage between terminals T1 and T2 of switch SW1 is relatively high, for example, greater than 10 V, or even greater than 50 V, or even still greater than 100 V, this current flowing from terminal T1 to terminal T2 via body diode Db can reach values likely to damage transistor MOS1. In the embodiment of FIG. 2, switch SW1 thus comprises a resistor R in series with transistor MOS1 between terminals T1 and T2. The value of resistor R is determined to maintain the maximum value that the current flowing through diode Db can take below a value which would damage transistor MOS1. The selection of the value of resistor R according to the application is within the abilities of those skilled in the art based on the functional indications given hereabove. Preferably, resistor R couples terminal T1 to the source of transistor MOS1. Preferably, resistor R has a terminal connected to the source of transistor MOS1 and another terminal connected to circuit 202 and to terminal T.

Figure 3:
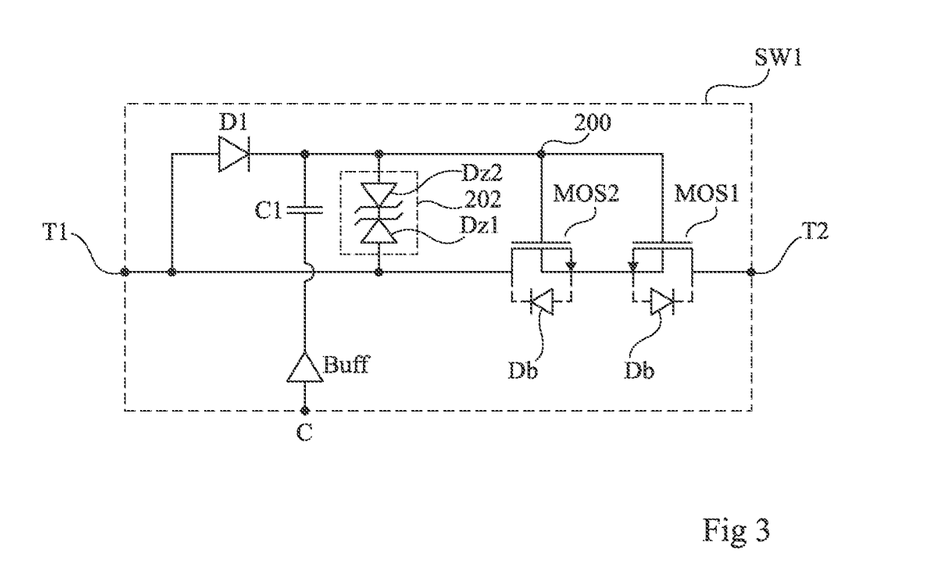
FIG. 3 illustrates an alternative embodiment of a switch comprising a MOS transistor.

FIG. 3 illustrates an alternative embodiment of switch SW1. The switch SW1 of FIG. 3 comprises many elements in common with the switch SW1 of FIG. 2, and only the differences between these two switches are detailed herein. In particular, unless indicated otherwise, all that has been described for the switch SW1 of FIG. 2 applies to the switch SW1 of FIG. 3.

As compared with the switch SW1 of FIG. 2, the switch SW1 of FIG. 3 further comprises a MOS transistor MOS2 having its gate connected to node 200, its source connected to the source of transistor MOS1, and its drain connected to terminal T1. Transistor MOS2 has a channel of the same type as the channel of transistor MOS1.

Transistor MOS2 has, like transistor MOS1, its source and its channel-forming region connected to each other. Thus, transistor MOS2 comprises, like transistor MOS1, a body diode Db shown in dotted lines in FIG. 3 and connected between the source and the drain of transistor MOS2.

The diodes Db of transistors MOS1 and MOS2 are connected in reverse to each other or, in other words, head to tail. Thus, when transistors MOS1 and MOS2 are in the off state and the voltage on terminal T1 is greater than the voltage on terminal T2 plus the threshold voltage of the diode Db of transistor MOS1, the diode Db of transistor MOS2 prevents the flowing of a current between terminals T1 and T2 via the diode Db of transistor MOS1.

In the switch SW1 of FIG. 3, the presence of transistor MOS2 having its source connected to the source of transistor MOS1 enables to suppress resistor R.

In the switch SW1 of FIG. 2, there is a capacitive dividing bridge formed by capacitive element C1 and the gate capacitance of transistor MOS1, and, in the switch SW1 of FIG. 3, there is a capacitive dividing bridge formed by capacitive element C1 and the gate capacitive element of the assembly of the two transistors MOS1 and MOS2. It is considered that a given voltage, for example, power supply voltage Vdd, is applied on capacitive element C1 from terminal C to turn on switch SW1. The voltage which is effectively received by the gate of transistor MOS1 in FIG. 2, respectively by the gates of transistors MOS1 and MOS2 in FIG. 3, is equal to A times this given voltage Vdd, A being an attenuation coefficient equal to C1val/(C1val+Cgval) where C1val is the capacitance value of capacitive element C1 and Cgval is the capacitance value of the gate of the transistor MOS1 of FIG. 2, respectively of the gates of the transistors MOS1 and MOS2 of FIG. 3.

It is desirable for the value of coefficient A to be as high as possible, for example, to decrease the on-state resistance of switches SW1 for a given voltage applied to element C1 to turn on switch SW1.

However, for the on-state resistance between the source and the drain of the transistor MOS1 of FIG. 2 to be equal to that between the drains of the transistors MOS1 and MOS2 of FIG. 3 when a given voltage is applied to element C1 from terminal C, not only the transistors MOS1 and MOS2 of FIG. 3 must be bigger than the transistor MOS1 of FIG. 2, but further, the value C1val of capacitive element C1 must be greater in FIG. 3 than in FIG. 2 to compensate for the increase of value Cgval resulting from the size increase of the transistors MOS1 and MOS2 of FIG. 3 with respect to that of the transistor MOS1 of FIG. 2. Thus, for a similar behavior in the on state, the switch SW1 of FIG. 2 is less bulky than that of FIG. 3.

Figure 4:
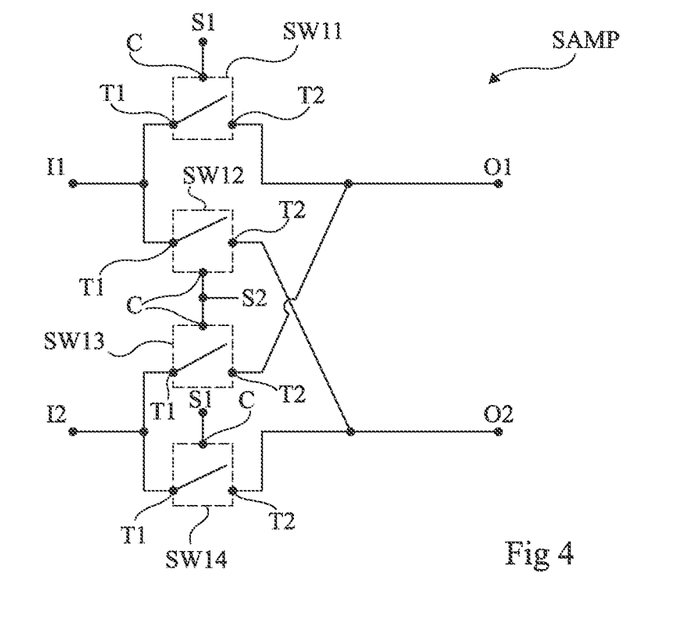
FIG. 4 illustrates an embodiment of a circuit for sampling an analog voltage.

FIG. 4 illustrates an embodiment of a sampling circuit SAMP.

Circuit SAMP comprises four switches SW1 such as previously described in relation with FIG. 2 or 3, the four switches being respectively referenced SW11, SW12, SW13, and SW14.

Switch SW11 has its terminal T1 connected to an input I1 of circuit SAMP, its terminal T2 connected to an output O1 of circuit SAMP, and its terminal C intended to receive a control signal S1, for example, a binary signal having its low level corresponding to a zero voltage and having its high level corresponding to power supply voltage Vdd.

Switch SW12 has its terminal T1 connected to the input I1 of circuit SAMP, its terminal T2 connected to an output O2 of circuit SAMP, and its terminal C intended to receive a control signal S2, for example, a binary signal having its low level corresponding to a zero voltage and having its high level corresponding to power supply voltage Vdd.

Switch SW13 has its terminal T1 connected to an input I2 of circuit SAMP, its terminal T2 connected to output O1 of circuit SAMP, and its terminal C intended to receive control signal S2.

Switch SW14 has its terminal T1 connected to the input I2 of circuit SAMP, its terminal T2 connected to the output O2 of circuit SAMP, and its terminal C intended to receive control signal S1.

Circuit SAMP is configured to receive a voltage to be sampled between its terminals I1 and I2.

Although this is not illustrated in FIG. 4, a control circuit is configured to deliver signals S1 and S2. More particularly, the control circuit is configured to alternate first and second operating phases. During each first phase, switches SW11 and SW14 are in the on state while switches SW12 and SW13 are in the off state and output O1, respectively O2, receives the voltage of input I1, respectively I2. During each second phase, switches SW12 and SW13 are in the on state while switches SW11 and SW14 are in the off state and output O1, respectively O2, receives the voltage of input I1, respectively I2.

The control circuit may further be configured to implement, after each first operating phase and before the next second operating phase, and after each second operating phase and before the next first operating phase, a third operating phase where switches SW11, SW12, SW13, and SW14 all are in the off state, to avoid for switches SW11 and SW13, respectively SW12 and SW14, to be simultaneously on.

Preferably, switches SW11, SW12, SW13, and SW14 are implemented as described in relation with FIG. 2 if the voltage between terminals I1 and I2 in normal operation remains sufficiently low, for example, lower than the conduction threshold of diodes Db, so that no current flows through the diodes Db of switches SW11 and SW14 when switches SW12 and SW13 are on, or through the diodes Db of switches SW12 and SW13 when switches SW11 and SW14 are on. If this is not the case, switches SW11, SW12, SW13, and SW14 are then preferably implemented as described in relation with FIG. 3.

According to an embodiment, circuit SAMP is implemented in an analog-to-digital converter, for example, an analog-to-digital converter configured to implement a sigma-delta conversion.

Figure 5:
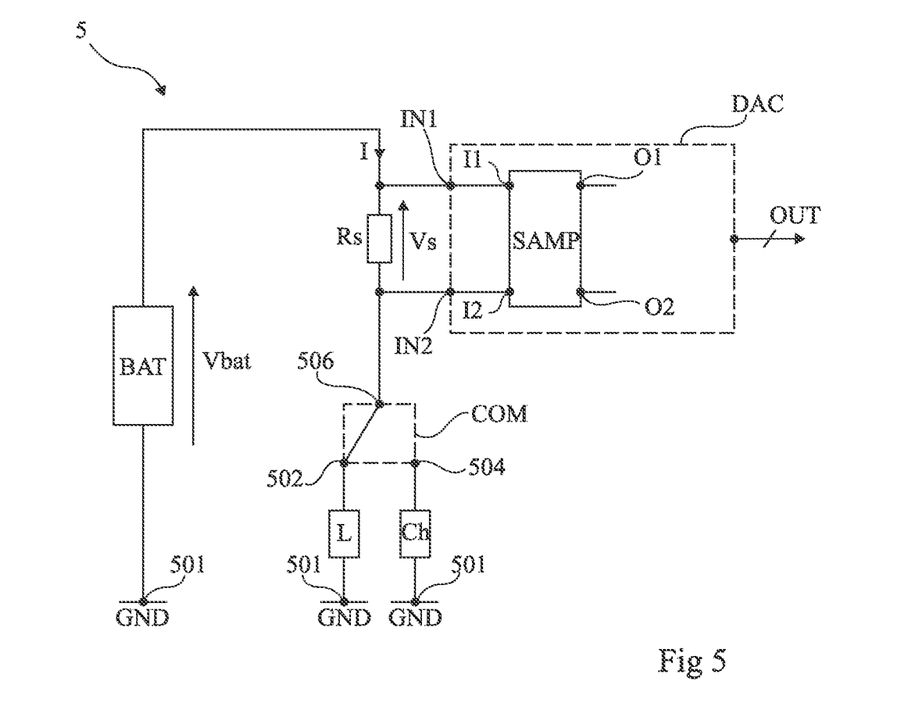
FIG. 5 illustrates an embodiment of a system comprising an analog-to-digital converter comprising the sampling circuit of FIG. 4.

FIG. 5 illustrates an embodiment of a system 5 comprising an analog-to-digital converter DAC comprising the sampling circuit SAMP of FIG. 4.

Converter DAC comprises a first input IN1, which is the same as the input I1 of circuit SAMP, and a second input IN2 which is the same as the input I2 of circuit SAMP.

Converter DAC is configured to receive, between its inputs IN1 and IN2, an analog voltage Vs to be converted into a digital word OUT.

Although this is not detailed in FIG. 5, according to an embodiment, converter DAC is configured to implement a sigma-delta conversion of voltage Vs.

Although this is not detailed in FIG. 5, according to an embodiment, the output O1 of circuit SAMP is coupled to an input of an operational amplifier of converter DAS, and the output O2 of circuit SAMP is coupled to another input of this operational amplifier. As an example, the operational amplifier is assembled as a differential integrator, for example, to implement a sigma-delta conversion of voltage Vs.

In FIG. 5, voltage Vs is the voltage available across a resistor Rs. Resistor Rs, also called shunt resistor, is here used to determine a current I flowing between these terminals, by measuring voltage Vs. As an example, resistor Rs has a value of a few milliohms.

In addition to converter DAC and resistor Rs, in the example of FIG. 5, system 5 comprises a battery BAT, a switch COM, a battery charger Ch, and a load L.

Load L is connected between a node 501 configured to receive reference voltage GND and an input 502 of switch COM.

Charger Ch is connected between node 501 and an input 504 of switch COM.

Battery BAT is series-connected with resistor Rs, between an output 506 of switch COM and node 501. Resistor Rs is connected between battery BAT and the output 506 of switch COM, so that battery BAT has a terminal connected to node 501.

Switch COM is configured to couple its output 506 selectively to its input 502 or to its input 504, according to a control signal (not shown) that it receives. When input 502 and output 506 are coupled to each other, battery BAT powers load L When input 504 and output 506 are coupled to each other, charger Ch powers and charges battery BAT.

In system 5, the voltage on the terminal of resistor Rs which is connected to battery BAT, that is, the voltage on input I1 of circuit SAMP, is equal to the voltage Vbat across battery BAT, where voltage Vbat may be greater than 10 V, or even greater than 50 V, or even still greater than 100 V. The voltage on the terminal of resistor Rs which is connected to the output 506 of circuit COM, that is, the voltage on input I2 of circuit SAMP, is zero when no current flows through resistor Rs, and close to voltage Vbat when a current flows through resistor Rs. Thus, when a current flows through resistor Rs, the voltage on each of the terminals I1 and I2 of circuit SAMP is relatively high and is greater than the maximum voltages that transistors MOS1 (FIG. 1 and FIG. 2) and MOS2 (FIG. 2) can withstand between their terminals, although the voltage between terminals I1 and I2 can be relatively low, for example, lower than 100 mV in absolute value.

In system 5, during a malfunction corresponding to the suppression of resistor Rs between battery BAT and switch COM, the voltage on terminal I1 is then equal to voltage Vbat and the voltage on terminal I2 is then zero. In the case where switches SW11, SW12, SW13, SW14 are implemented as described in relation with FIG. 2, the current flowing through the diodes Db of the transistors MOS1 of switches SW11 and SW14 when switches SW12 and SW13 are on, or switches SW12 and SW13 when switches SW11 and SW14 are on, remains limited by the provision of resistors R, which enables not to damage these transistors MOS1. In the case where switches SW11, SW12, SW13, and SW14 are implemented as described in relation with FIG. 3, no current can flow through transistors MOS1, which are controlled to the off state.

Although a specific system 5 where converter DAC is configured to convert voltage Vs to determine a current supplied by battery BAT to load L or a current supplied by charger Ch to battery BAT has been described, converter DAC may be used to convert other voltages, for example, a voltage between two nodes which is relatively low, for example, lower than 100 mV, while the voltage on each of these two nodes is relatively high, for example, higher than the maximum voltages that a MOS transistor can withstand between its gate and its source, or between its source and its channel-forming region. As an example, converter DAC may be used to measure the voltage across a cell of a battery comprising a plurality of identical battery cells connected in series.

Figure 6:
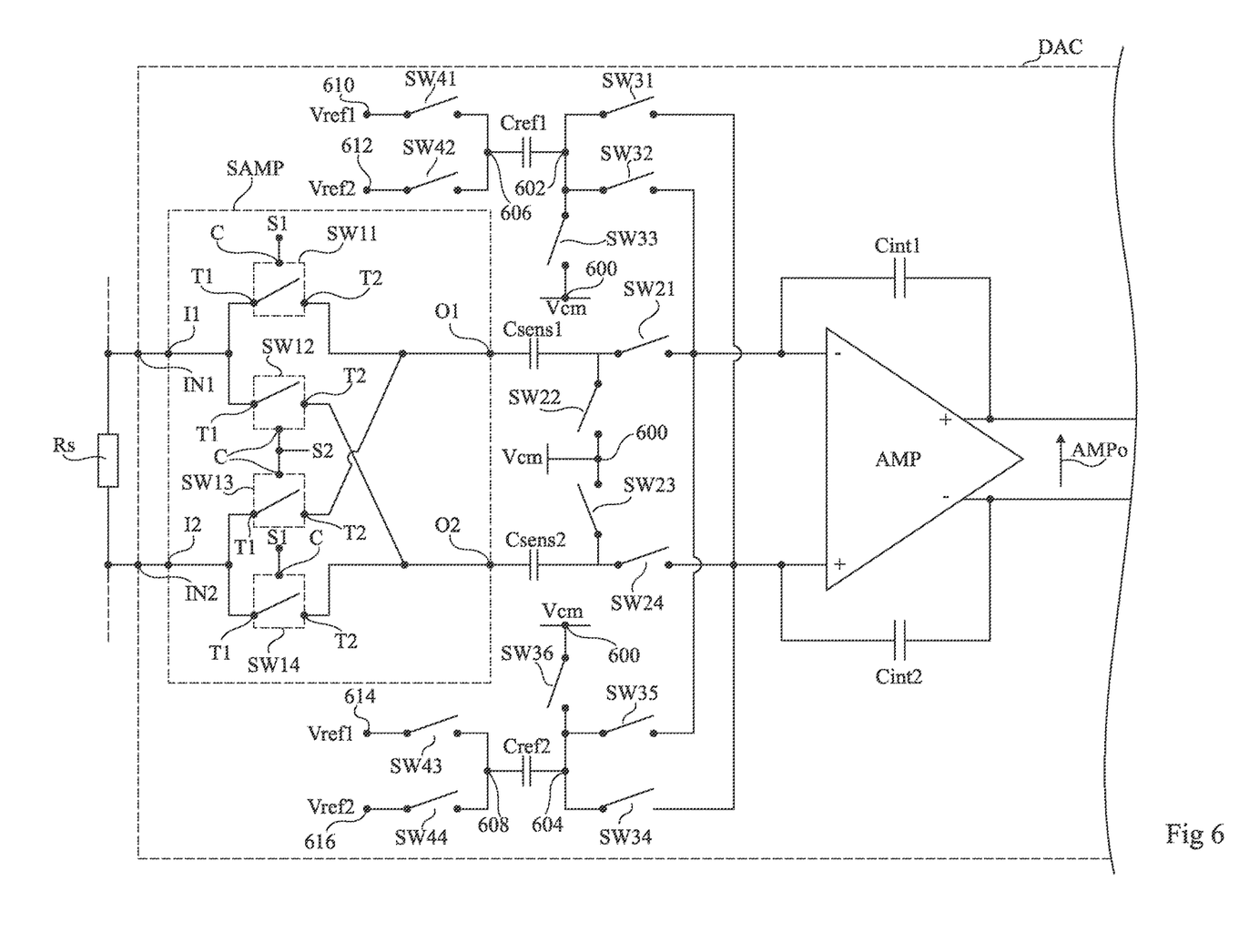
FIG. 6 illustrates a more detailed example of an embodiment of the converter of FIG. 5.

FIG. 6 illustrates a more detailed example of an embodiment of the converter DAC of FIG. 5, and more particularly a more detailed example of an embodiment where converter DAC is configured to implement a sigma-delta converter.

As in FIG. 5, the DAC converter comprises circuit SAMP.

Converter DAC further comprises two capacitive elements Csens1 and Csens2, for example, two capacitors. Preferably, the two capacitive elements are identical.

Capacitive element Csens1, respectively Csens2, has a first electrode connected to the output O1, respectively O2, of circuit SAMP.

Converter DAC comprises an operational amplifier AMP. Amplifier AMP is assembled as an integrator. For example, amplifier AMP is a differential amplifier, that is, it is configured to deliver a differential output signal between two outputs of the amplifier. Preferably, amplifier AMP is assembled as a differential integrator, and a differential output signal AMP0, for example, a voltage, is available between the non-inverting (+) and inverting (−) inputs of amplifier AMP.

Amplifier AMP has a first input, for example, inverting (−) coupled to the output O1 of circuit SAMP, and, more particularly, to a second electrode of capacitive element Csens1. Amplifier AMP has a second input, for example, non-inverting (+), coupled to the output O2 of circuit SAMP, and, more particularly, to a second electrode of capacitive element Csens2.

According to an embodiment, a capacitive element Cint1, for example, a capacitor, is connected between the first input of amplifier AMP and a first output, for example, non-inverting (+), of amplifier AMP. Element Cint1 forms a negative feedback loop between the first output and the first input of amplifier AMP. Symmetrically, a capacitive element Cint2, for example, a capacitor, is connected between the second input of amplifier AMP and a second output, for example, inverting (−), of amplifier AMP. Element Cint2 forms a negative feedback loop between the second output and the second input of amplifier AMP. Preferably, the two elements Cint1 and Cint2 are identical.

Converter DAC further comprises four switches SW21, SW22, SW23, and SW24. Switches SW21, SW22, SW23, and SW24 are for example implemented as described in relation with FIG. 1.

Switch SW21 couples capacitive element Csens1 and, more particularly, the second electrode of capacitive element Csens1, to the first input of operational amplifier AMP. In other words, switch SW21 is connected between element Csens1 and the first input of amplifier AMP. For example, switch SW21 has a conduction terminal coupled, preferably connected, to the second electrode of element Csens1 and another conduction terminal coupled, preferably connected, to the first input of amplifier AMP.

Switch SW24 couples capacitive element Csens2 and, more particularly, the second electrode of capacitive element Csens2, to the second input of operational amplifier AMP. In other words, switch SW24 is connected between element Csens2 and the second input of amplifier AMP. For example, switch SW24 has a conduction terminal coupled, preferably connected, to the second electrode of element Csens2 and another conduction terminal coupled, preferably connected, to the second input of amplifier AMP.

Switch SW22 couples capacitive element Csens1 and, more particularly, the second electrode of capacitive element Csens1, to a node 600 configured to receive a potential Vcm. In other words, switch SW22 is connected between element Csens1 and node 600. For example, switch SW22 has a conduction terminal coupled, preferably connected, to the second electrode of element Csens1 and another conduction terminal coupled, preferably connected, to node 600.

Switch SW23 couples capacitive element Csens2, and, more particularly, the second electrode of capacitive element Csens2, to node 600. In other words, switch SW23 is connected between element Csens2 and node 600. For example, switch SW23 has a conduction terminal coupled, preferably connected, to the second electrode of element Csens2 and another conduction terminal coupled, preferably connected, to node 600.

Potential Vcm determines the common-mode potential of amplifier AMP.

Although this is not illustrated in FIG. 6, converter DAC for example comprises a circuit for controlling switches SW21, SW22, SW23, and SW24, which circuit may also be the circuit for controlling switches SW11, SW12, SW13, and SW14. The control circuit is configured to alternate phases where switches SW21 and SW24 are on while switches SW22 and SW23 are maintained off, and phases where switches SW22 and SW23 are on while switches SW21 and SW24 are maintained off. Preferably, switches SW12 and SW13 are switched to the on state at each phase where switches SW21 and SW24 are on, and switches SW11 and SW14 are maintained off at each phase when switches SW21 and SW24 are on. Preferably, switches SW11 and SW14 are switched to the on state at each phase where switches SW22 and SW23 are on, and switches SW12 and SW13 are maintained off at each phase when switches SW22 and SW23 are on.

According to an embodiment where converter DAC is configured to implement a sigma-delta conversion, converter DAC for example comprises a switch SW31 connected between the second input of amplifier AMP and a node 602, a switch SW32 connected between the first input of amplifier AMP and node 602, a switch SW33 connected between node 602 and node 600, a switch SW34 connected between the second input of amplifier AMP and a node 604, a switch SW35 connected between the first input of amplifier AMP and node 604 and a switch SW36 connected between node 604 and node 600.

As an example, switches SW31, SW32, SW33, SW34, SW34, SW35, and SW36 are implemented as described in relation with FIG. 1.

Although this is not illustrated in FIG. 6, converter DAC for example comprises a circuit for controlling switches SW31, SW32, SW33, SW34, SW34, SW35, and SW36. The control circuit is configured to control these switches to implement the sigma-delta conversion. As an example, this control circuit is also the circuit for controlling switches SW11, SW12, SW13 and SW14, and/or switches SW21, SW22, SW23, and SW24.

As an example, the control circuit is configured to control switches SW33 and SW36 like switches SW22 and SW23.

As an example, the control circuit is configured to control switch SW31 like switch SW35, and to control switch SW32 like switch SW34. For example, according to the result of a comparison of signal AMP0 with a threshold, either the circuit controls switches SW32 and SW34 like switches SW21 and SW24 by then maintaining switches SW31 and SW35 off, particularly when switches SW32, SW34, SW21, and SW24 are on, or the circuit controls switches SW31 and SW35 like switches SW21 and SW24 by maintaining switches SW32 and SW34 off, particularly when switches SW31, SW35, SW21, and SW24 are on.

According to an embodiment where converter DAC is configured to implement a sigma-delta conversion, and where converter DAC comprises switches SW31, SW32, SW33, SW34, SW35, and SW36, converter DAC for example further comprises a capacitive element Cref1, for example, a capacitor, connected between node 602 and a node 606, a capacitive element Cref2, for example, a capacitor, connected between node 604 and a node 608, elements Cref1 and Cref2 being preferably identical, a switch SW41 connected between node 606 and a node 610 configured to receive a potential Vref1, a switch SW42 connected between node 606 and a node 612 configured to receive a potential Vref2, a switch SW43 connected between node 608 and a node 614 configured to receive potential Vref1 and a switch SW44 connected between node 608 and a node 616 configured to receive potential Vref2.

As an example, switches SW41, SW42, SW43, and SW44 are implemented as described in relation with FIG. 1.

Although this is not illustrated in FIG. 6, converter DAC for example comprises a circuit for controlling switches SW41, SW42, SW43, and SW44. This control circuit is configured to control these switches to implement the sigma-delta conversion. As an example, this control circuit is also the circuit for controlling switches SW11, SW12, SW13 and SW14, and/or switches SW21, SW22, SW23, and SW24, and/or switches SW31, SW32, SW33, SW34, SW35, and SW36.

As an example, the control circuit is configured to control switches SW41 and SW44 like switches SW11 and SW14, and to control switches SW42 and SW43 like switches SW12 and SW13.

Although this is not illustrated in FIG. 6, those skilled in the art are capable of implementing the rest of converter DAC, for example, the comparator configured to compare signal AMP0 with a threshold and/or the switch control circuit(s) and/or the circuit for sampling the result of the comparison and/or the decimator circuit. In particular, those skilled in the art will be capable of determining the values of the potentials Vref1 and Vref2 used to implement the sigma-delta feedback loop and/or of modifying the controls of the switches with respect to the previously-described examples.

Figure 7:
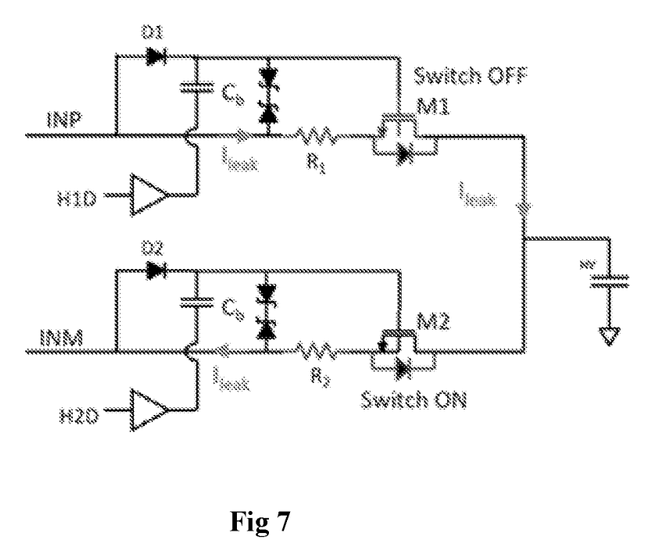
FIG. 7 illustrates an embodiment of a portion of FIG. 6.

FIG. 7 illustrates an embodiment of a sampling circuit SAMP in FIG. 4 implemented in FIG. 6. The sampling circuit SAMP is based on the switch of FIG. 2. FIG. 7 represents two switches SW11 and SW13 and/or SW12 and SW14. The capacitive element at the output of half of the sampling circuit SAMP (SW11 and SW13 and/or SW12/SW14) can be identified as capacitive element Csens1 and/or capacitive element Csens2 in FIG. 6.

The double Zener diodes Dz1 and Dz2 have a better known and more accurate activation threshold than a standard diode stack for which the threshold is very temperature and process dependent. This allows a good sampler performance independent of temperature and process variations.

The resistor R1/R2 in series with the respective switch transistor M1/M2 is useful in this embodiment since it limits the leakage current Ileak inside the sampling circuit SAMP for high voltage applications (e.g., applications above 20V or between 20V or 50V and 200V) and therefore prevents damage to the sampling circuit SAMP or the converter DAC. The switches M1 and M2 show specific states FIG. 7 but can have different states (e.g., M1 ON and M2 OFF).

Higher resistance values for the resistor R1/R2 may make the sampler performance of the sampling circuit SAMP less accurate. Therefore, the value of the resistor R1/R2 should be chosen to limit the leakage current without (substantially) reducing the sampler performance. For example, a resistance value of 500 for the resistors R1 and/or R2 for an input voltage of 65 V between I1/INP and I2/INM could limit the leakage current Ileak to equal or below 2 mA without (substantially) impacting the sampling performance.

Various embodiments and variants have been described. Those skilled in the art will understand that certain features of these various embodiments and variants may be combined, and other variants will occur to those skilled in the art.

In particular, although examples of embodiments of switches SW1 where transistors MOS1 and MOS2 have an N channel have been described, those skilled in the art are capable of adapting these examples to the case where these transistors have a P channel. For example, in the case where the voltages on terminals T1 and T2 are negative with respect to reference voltage GND, those skilled in the art will be capable of adapting the high and low levels of the control signals delivered to the terminals C of the switches and/or of replacing the N-channel transistors MOS1 and MOS2 with P-channel transistors MOS1 and MOS2 and/or of adapting the connection direction of the diode D1 of switches SW1.

It has been indicated in relation with FIG. 3 that the source of transistor MOS2 is connected to the source of transistor MOS1, which enables to suppress the resistor R described in relation with FIG. 2 to protect the source of transistor MOS1. In an alternative embodiment, not illustrated, the position of transistors MOS1 and MOS2 may be inverted by connecting the drain of transistor MOS1 to the drain of transistor MOS2 and by connecting resistor R to the source of transistor MOS1 similarly to what has been described in relation with FIG. 1.

Finally, the practical implementation of the described embodiments and variations is within the abilities of those skilled in the art based on the functional indications given hereabove.

What is claimed is:

1. A switch comprising:
a first MOS transistor comprising a source, a drain, a gate, and a channel-forming region, the source connected to the channel-forming region and coupled with a first terminal of the switch, the drain coupled with a second terminal of the switch, and the gate connected to a first node of the switch;
a diode coupling the first terminal with the first node;
a capacitive element coupling a third terminal of the switch with the first node, the third terminal being configured to receive a control signal for the switch; a discharge circuit coupling the first node with the first terminal, the discharge circuit configured to conduct only when a voltage between the first node and the first terminal is greater than or equal to a threshold; and
a buffer circuit connected between the third terminal and the capacitive element.

2. The switch according to claim 1, wherein the discharge circuit comprises two Zener diodes series connected and reversely connected with respect to each other between the first node and the first terminal.

3. The switch according to claim 1, wherein the buffer circuit is configured to deliver a binary signal having a first level corresponding to a power supply voltage and a second level corresponding to a zero voltage.

4. The switch according to claim 1, wherein the diode has its anode towards the first terminal.

5. The switch according to claim 1, further comprising a resistor in series with the first MOS transistor, wherein the resistor is located between the first and second terminals.

6. The switch according to claim 5, wherein the resistor is connected between the first terminal and the source of the first MOS transistor.

7. The switch according to claim 1, further comprising a second MOS transistor comprising a source, a drain, a gate, and a channel-forming region, the gate of the second MOS transistor connected to the gate of the first MOS transistor, the source of the second MOS transistor connected to the source of the first MOS transistor and with a channel-forming region of the second MOS transistor, and the drain of the second MOS transistor connected to the first terminal.

8. A sampling circuit comprising:
a plurality of switches, each switch of the plurality of switches comprising:
a first MOS transistor comprising a source, a drain, a gate, and a channel-forming region, the source connected to the channel-forming region and coupled with a first terminal of the switch, the drain coupled with a second terminal of the switch, and the gate connected to a first node of the switch;
a diode coupling the first terminal with the first node;
a capacitive element coupling a third terminal of the switch with the first node, the third terminal being configured to receive a control signal for the switch; and
a discharge circuit coupling the first node with the first terminal, the discharge circuit configured to conduct only when a voltage between the first node and the first terminal is greater than or equal to a threshold,
wherein the plurality of switches comprises a first switch, a second switch, a third switch and a fourth switch,
wherein the first and second switches have their first terminals coupled with a first input of the sampling circuit,
wherein the third and fourth switches have their first terminals coupled with a second input of the sampling circuit, wherein the first and third switches have their second terminals coupled with a first output of the sampling circuit,
wherein the second and fourth switches have their second terminals coupled with a second output of the sampling circuit,
wherein third terminals of the first and fourth switches are configured to receive a first control signal, and
wherein the third terminals of the second and third switches are configured to receive a second control signal.

9. An analog-to-digital converter comprising:
the sampling circuit according to claim 8.

10. The converter according to claim 9, further comprising:
a first input of the converter comprising the first input of the sampling circuit; and
a second input of the converter comprising the second input of the sampling circuit,
wherein the converter is configured to receive an analog voltage to be converted between the first and second inputs.

11. The converter according to claim 10, further comprising an operational amplifier, wherein a first input of the amplifier is coupled with the first output of the sampling circuit and a second input of the amplifier is coupled with the second output of the sampling circuit.

12. The converter according to claim 11, wherein the operational amplifier is a differential integrator.

13. The converter according to claim 11, further comprising:
a first capacitive element having a first electrode connected to the first output of the sampling circuit;
a second capacitive element having a first electrode connected to the second output of the sampling circuit;
a fifth switch connected between a second electrode of the first capacitive element and the first input of the amplifier;
a sixth switch connected between the second electrode of the first capacitive element and a second node configured to receive a first potential;
a seventh switch connected between a second electrode of the second capacitive element and the second input of the amplifier; and
an eighth switch connected between the second electrode of the second capacitive element and the second node.

14. The converter according to claim 13, further comprising:
a third capacitive element connected between a first output of the amplifier and the second input of the amplifier; and
a fourth capacitive element connected between a second output of the amplifier and the first input of the amplifier.

15. The converter according to claim 9, wherein the converter is configured to perform a sigma-delta conversion.

16. A system comprising:
a switch having a first input connected to a load and a second input connected to a charger;
a battery and a sense resistor in series between a node configured to receive ground and an output of the switch; and
the converter according to claim 9,
wherein the sense resistor is connected between the first and second inputs of the converter.

17. An analog-to-digital converter comprising:
a plurality of switches comprising a first switch, a second switch, a third switch and a fourth switch, each switch of the plurality of switches comprising:
a first MOS transistor comprising a source, a drain, a gate, and a channel-forming region, the source connected to the channel-forming region and coupled with a first terminal of the switch, the drain coupled with a second terminal of the switch, and the gate connected to a first node of the switch;
a second MOS transistor comprising a source, a drain, a gate, and a channel-forming region, the gate connected to the gate of the first MOS transistor, the source of the second MOS transistor connected to the source of the first MOS transistor and with a channel-forming region of the second MOS transistor, and the drain of the second MOS transistor connected to the first terminal;
a diode coupling the first terminal with the first node;
a capacitive element coupling a third terminal of the switch with the first node, the third terminal being configured to receive a control signal for the switch; and
a discharge circuit coupling the first node with the first terminal, the discharge circuit configured to conduct only when a voltage between the first node and the first terminal is greater than or equal to a threshold,
wherein the first and second switches have their first terminals coupled with a first input of the converter,
wherein the third and fourth switches have their first terminals coupled with a second input of the converter,
wherein the first and third switches have their second terminals coupled with a first output of a sampling circuit of the converter,
wherein the second and fourth switches have their second terminals coupled with a second output of a sampling circuit of the converter,
wherein third terminals of the first and fourth switches are configured to receive a first control signal, and
wherein the third terminals of the second and third switches are configured to receive a second control signal.

18. The converter according to claim 17, wherein each switch further comprises a buffer circuit connected between the third terminal and the capacitive element, and wherein each of the discharge circuit comprises two Zener diodes series connected and reversely connected with respect to each other between the first node and the first terminal.

19. An analog-to-digital converter comprising:
a plurality of switches comprising a first switch, a second switch, a third switch and a fourth switch, each switch of the plurality of switches comprising:
a MOS transistor comprising a source, a drain, a gate, and a channel-forming region, the source connected to the channel-forming region and coupled with a first terminal of the switch, the drain coupled with a second terminal of the switch, and the gate connected to a first node of the switch;
a diode coupling the first terminal with the first node;
a capacitive element coupling a third terminal of the switch with the first node, the third terminal being configured to receive a control signal for the switch;
a resistor series connected with the MOS transistor, wherein the resistor is located between the first terminal and the source of the MOS transistor and configured to limit a leakage current; and a discharge circuit comprising two Zener diodes series connected and reversely connected with respect to each other between the first node and the first terminal, and configured to conduct only when a voltage between the first node and the first terminal is greater than or equal to a threshold, wherein the first and second switches have their first terminals coupled with a first input of the converter, wherein the third and fourth switches have their first terminals coupled with a second input of the converter, wherein the first and third switches have their second terminals coupled with a first output of the converter, wherein the second and fourth switches have their second terminals coupled with a second output of the converter, wherein third terminals of the first and fourth switches are configured to receive a first control signal, and wherein the third terminals of the second and third switches are configured to receive a second control signal.

* * * * *